United States Patent [19]

Beyer et al.

[11] Patent Number: 4,944,836

[45] Date of Patent: * Jul. 31, 1990

[54] CHEM-MECH POLISHING METHOD FOR PRODUCING COPLANAR METAL/INSULATOR FILMS ON A SUBSTRATE

[75] Inventors: Klaus D. Beyer; William L. Guthrie, both of Poughkeepsie; Stanley R. Makarewicz, New Windsor; Eric Mendel, Poughkeepsie; William J. Patrick, Newburgh; Kathleen A. Perry, Lagrangeville; William A. Pliskin, Poughkeepsie; Jacob Riseman, Poughkeepsie; Paul M. Schaible, Poughkeepsie; Charles L. Standley, Wappingers Falls, all of N.Y.

[73] Assignee: International Business Machines Corporation, Armonk, N.Y.

[ * ] Notice: The portion of the term of this patent subsequent to Dec. 6, 2005 has been disclaimed.

[21] Appl. No.: 791,860

[22] Filed: Oct. 28, 1985

[51] Int. Cl.$^5$ .................... H01L 21/304; H01L 21/306

[52] U.S. Cl. .................... 156/645; 156/656; 156/665

[58] Field of Search .............. 156/636, 695, 656, 657, 156/662, 664, 665; 427/88, 89, 90, 91

[56] References Cited

U.S. PATENT DOCUMENTS

| | | | |
|---|---|---|---|
| 2,933,437 | 4/1960 | Loosme | 156/636 |
| 3,009,841 | 11/1961 | Faust, Jr. | 148/1.5 |
| 3,386,864 | 6/1968 | Silvestri et al. | 148/175 |
| 3,911,562 | 10/1975 | Youmans | 29/590 |
| 4,037,306 | 7/1977 | Gutteridge et al. | 29/577 |
| 4,057,939 | 11/1977 | Basi | 51/281 |
| 4,233,091 | 11/1980 | Kawabe | 148/175 |
| 4,305,779 | 12/1981 | Steeves et al. | 156/636 |
| 4,375,645 | 3/1983 | Funatsu | 357/50 |
| 4,475,981 | 10/1984 | Rea | 156/636 |
| 4,526,631 | 7/1985 | Silvestri et al. | 156/648 |

FOREIGN PATENT DOCUMENTS 0023146 1/1981 European Pat. Off. ............. 21/90

OTHER PUBLICATIONS

IBM Tech. Disc. Bull., vol. 20, No. 11A, Apr. 1978, "Test Site Failure Analysis: Two Levels of Metal for Isolation of Components" C. H. Scrivner, Jr., pp. 4430-4431.
IBM Tech. Disc. Bull., vol. 24, No. 4, Sep. 1981 "Polishing Technique to Remove Aluminum Lands from Semiconductor Chips" C. H. Scrivner, Jr., p. 2138.
IBM Tech. Disc. Bull., vol. 15, No. 6, Nov. 1972, "Planetary 'Free' Wafer Polisher" F. E. Goetz et al., pp. 1760-1761.
IBM Tech. Disc. Bull., vol. 24, No. 8, Jan. 1982, "Semiconductor Polishing Composition", E. Mendel, p. 4232.
IBM Tech. Disc. Bull., vol. 23, No. 7A, Dec. 1980, "Semiconductor Polishing Composition", B. Holley et al., p. 2750.
IBM Tech. Disc. Bull., vol. 25, No. 9, Feb. 1983, "Polishing Electroless Nickel", E. Mendel, p. 4758.
IBM Technical Disclosure Bulletin, vol. 26, No. 3A, "Photosensitive Glass for Producing Recessed Metallurgy, Eliminating Need for Planarization" by R. R. Shaw et al., p. 1094, Aug. 1983.
IBM Technical Disclosure Bulletin, vol. 23, No. 4, Sep. 1980 "Reactive Ion Etch Process for Metal Wiring Using a Buried Mask" by J. R. Kitcher, p. 1394.

Primary Examiner—Kenneth M. Schor
Attorney, Agent, or Firm—John A. Stemwedel

[57] ABSTRACT

A method is disclosed for producing coplanar metal/insulator films on a substrate according to a chem-mech polishing technique. In one example, a substrate having a patterned insulating layer of dielectric material thereon, is coated with a layer of metal. The substrate is then placed in a parallel polisher and the metal is removed elsewhere except in the holes where it is left intact. This is made possible through the use of an improved selective slurry which removes the metal much faster than the dielectric material. The insulating layer may then be used as an automatic etch stop barrier.

In a second example a substrate having a patterned metallic layer is coated with an insulating layer and then subjected to chem-mech polishing. The structure is coplanarized by the chem-mech removal of the insulating material from the high points of the structure at a faster rate than from the lower points. Optional etch stop layers also may be used.

11 Claims, 2 Drawing Sheets

CHEM-MECH POLISHING METHOD FOR PRODUCING COPLANAR METAL/INSULATOR FILMS ON A SUBSTRATE

BACKGROUND OF THE INVENTION

1. Field of the Invention

The present invention relates to the manufacture of high performance VLSI semiconductor chips in general and, more particularly, to a method for producing coplanar metal/insulator films on a substrate according to a chemical-mechanical (chem-mech) polishing technique with an improved polishing slurry. The above method may find extensive use in the fabrication of planarized multilevel metal semiconductor structures.

2. Description of the Prior Art

A semiconductor chip consists of an array of devices whose contacts are interconnected by patterns of wiring metal stripes. In VLSI chips, these metal patterns are multilayered and separated by layers of an insulating material. Interconnections between different metal wiring patterns are made by holes (or via holes), which are etched through said layers of insulating material. Typical chip designs consist of one or two wiring levels, with three wiring levels being the current state of the art. Circuit cost and performance continue to place demand on the fabrication processes in such a way that adding supplementary wiring levels can be competitive even though additional processing steps are required. However, the technique using via-holes, although widely used today, has multiple limitations and drawbacks in that, as the number of metallization layers increases wiring becomes increasingly difficult, as may be clearly understood from FIG. 1.

The semiconductor structure 10 shown in FIG. 1 is a typical example of said current state of the art technology. It is comprised of a silicon substrate 11 of a predetermined conductivity type having a patterned first insulating layer 12 of silicon dioxide ($SiO_2$) thereon. The first level of metallization is represented by a metal land 13 which makes an electrical contact through via hole 14 with a region 15 of the substrate. It makes contact, for example as an ohmic contact with the emitter region of a bipolar transistor (not represented).

The second level of metallization represented by metal land 16 makes an electrical contact with metal 13 through via hole 17 of the second insulating layer 18. The structure passivated with a third insulating layer 19. Although the structure depicted in FIG. 1 is not to scale, it gives a good idea of the very irregular surface, far from planar, which results from the standard process.

With such a structure, the known dangers are: first of a potential short at locations A between the first and second levels of metallization, due to the thinning of the insulating layer therebetween, and second the risk of a potential open circuit at locations B, due to the thinning of the metal layer at that location (so called necking effect). Those risks are unacceptable for the high standard of reliability which are required in the industry. Therefore, there is a present and serious need to improve the via-hole technique to solve the acute problem of planarizing such irregular surfaces.

A typical example of advanced planarization techniques can be found in European Patent Application No. 80302457.9 to K. Tokitomo et al. According to the teachings of that particular reference, any kind of protuberances at the surface of a semiconductor structure may be removed by the following process: formation of a photoresist layer onto said surfaces, photoresist having a substantially planar surface, and then dry etching the top surface of the structure using a reaction gas which etches both the photoresist and the material forming said protuberances at the same rate. When the material to be removed is phosphosilicate glass (PSG), the reaction gas is a mixture of a fluorine compound and oxygen, when the material is aluminum the reaction gas is a mixture of a chlorine based compound and hydrogen or oxygen. For each material, the reaction gas must be selected appropriately.

This process has several and significant disadvantages which are listed below:

1. Only the second level of metallization (and the following) are planarized, so there still remains a potential risk of necking for the second level metal land (see FIG. 5 of European Patent Application No. 80302457.9).

2. The second insulating layer is very thin at the locations where the first level metal land overlies the first insulating layer. This may cause shorts between metal lines at different levels and undesired parasitic capacitances and coupling as well (see FIG. 5 of European Patent Application No. 80302457.9).

3. The etch back operation must be controlled very accurately, because there is no natural etch stop barrier to end the process, and variations in etch rate exist within a wafer and from wafer to wafer. The risk is to expose the top of the first level metallization (see FIG. 5 of European Patent Application No. 80302457.9).

4. Due to the absence of said etch stop barrier, the dry etching of aluminum is effected in a two step process with a change in the nature of the reaction gas (see FIGS. 12-13).

More generally, plasma etching or Reactive Ion Etching (RIE) of metals with a resist planarizing medium, which appears to be the preferred methods for planarizing semiconductor devices, have limitations inherent to those techniques. First, these techniques cannot be used with all metals but only with those forming volatile reaction products. Then, as far as aluminum is concerned the process is complicated by the presence of a thin $Al_2O_3$ layer at the surface of the metal. It has been reported that an unpredictable initiation period is required to remove this $Al_2O_3$ layer, followed by a rapid, nonuniform removal of the aluminum layer itself, making this a difficult process to control. Lastly, RIE processes are complex and costly. In addition the use of a resist may also be a source of contamination.

No suggestion is known to have been made so far of using a chem-mech polishing process for planarization of metals and insulators. The use of mechanical polishing (or abrasive polishing) was recently reported in two articles authored by C. H. Scrivner, for the rapid removal of aluminum lands at the second level of metallization for testing purposes.

In the first article, published in the IBM Technical Disclosure Bulletin, Vol. 20, No. 11A, pages 4430-4431, April 1978, the special design of a test site chip is described that lends itself to easy laboratory diagnosis. To use this test site as described one must have the ability to remove the metal at the second level to isolate the via-holes. This is accomplished abrasively by parallel polishing the whole wafer. The metal is left intact in the via-holes for probing purposes. Although the composition of the polishing slurry is not disclosed, a standard polishing slurry such as a water based silica or alumina slurry could be used.

Further information concerning the use of a polishing slurry may be found in the second article published in the IBM Technical Disclosure Bulletin, Vol. 24, No. 4, Sept. 1981, page 2138. According to the latter, the test site chip or a piece of the wafer containing it is mounted on a metal stud (2.5 cm in diameter), which in turn is inserted in a commercial parallel polisher that polishes the surface of the chip. This article clearly points out the disadvantages of the previous cited technique, and in particular it mentions that the polishing step is destructive to the wafer. Also, when only a small area of the wafer is concerned, the article suggests the use of a pencil eraser dipped in a slurry of alumina powder, to manually remove the second level of metal on a limited portion of the chip.

There are a number of reasons that would have prevented one skilled in the art to apply above mechanical polishing techniques with an alumina slurry to the planarization of multilayered metal structures. First, alumina is considered to be an abrasive agent. Although used for lapping, alumina is not used for final chem-mech polishing of silicon substrates due to its higher crystal damage tendency as compared to silica slurries. However, U.S. Pat. No. 4,375,675 to T. Funatsu, describes a polysilicon isolation planarization process using an alumina slurry with alkali additives to give selective chem-mech removal of the polysilicon fill relative to the $Si_3N_4$ etch stop layer, but both active and passive devices have not been formed yet at this stage of the process. A similar disclosure may be found in U.S. Pat. No. 3,911,562 to Youmans.

Another reason is that using mechanical polishing with a water based alumina slurry to remove an Al-Cu from an insulating surface does not provide a controllable process for producing metallization structures. Demonstration will be given below (see Table I) that such a slurry polishes Al-Cu and $SiO_2$ with equal etch rates, leading to significant removal of the insulating layer. So there is still a demand for a new and improved method of producing coplanar metal/insulator films on a substrate.

SUMMARY OF THE INVENTION

It is therefore a primary object of the invention to provide a method for producing coplanar metal/insulator films on a substrate without requiring the complex, poorly controlled, costly and contaminating dry etching planarization techniques.

It is another object of the invention to provide a method for producing coplanar metal/insulator films on a substrate according to a chem-mech technique without any limitations as to the nature of the metal or of the insulator.

It is another object of the present invention to provide a method for producing coplanar metal/insulator films on a substrate according to the chem-mech technique where fine metal geometries may be obtained.

It is still another object of the invention to provide a method for producing coplanar metal/insulator films on a substrate according to the chem-mech technique with improved selective slurries which have significantly different removal rates for the metal than for the insulator, to allow the insulator or the metal to be used as an automatic etch stop barrier in a very controllable process.

According to the present invention coplanar metal-/insulator films are produced on a substrate by the method including the steps of: providing a substrate, forming (in a first embodiment) on said substrate a layer of an insulating material having at least a via hole, a line recess, or a combination thereof, and depositing a layer of a conductive metal onto the structure, characterized in that said metal is chem-mech polished with a slurry having a significantly higher removal rate for the metal than for the insulating material. Therefore, said layer of insulating material may be used as an automatic polishing or etch stop layer, if desired. Alternatively, a polishing stop layer per se may be used on top of the insulating material.

Where aluminum based alloys such as Al-Cu and doped or non-doped glasses such as $SiO_2$ are respectively used as the metal and the insulating material, the slurry is preferably comprised of an alumina powder in a diluted acid (typically $HNO_3$ solution) to produce a pH less than about 3. A suitable polishing stop material, if desired, is a silicon nitride film.

The above method may be used at any level of metallization in the fabrication process of multilayered metal semiconductor structures and repeated the desired number of times to produce planar structures.

In a second embodiment, a layer of patterned conductive metal is formed on a substrate and a layer of an insulating material is deposited onto the structure. The insulating material is chem-mech polished with a slurry. Again, a polishing stop layer, per se, is optional. In both embodiments, the insulating layer may be quartz or polyimide or other material.

Additional objects and features of the invention will become apparent from the following description in which the preferred embodiment is set forth in conjunction with the accompanying drawings.

DETAILED DESCRIPTION OF THE PREFERRED EMBODIMENT

Example I

Figure 1:
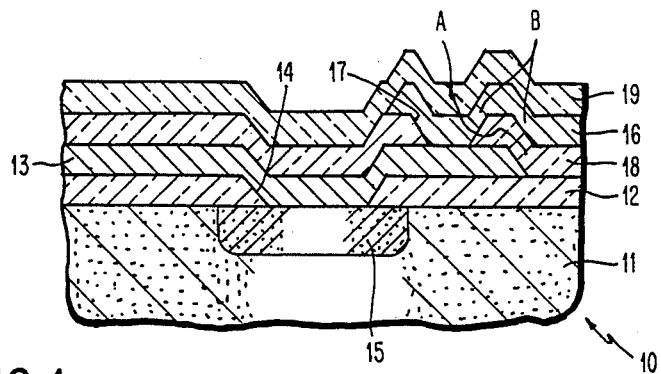
FIG. 1 shows a schematic cross-sectional view of a multilayered metal semiconductor structure fabricated according to standard processes and exhibiting a typical non-planar surface.
Figure 2A:
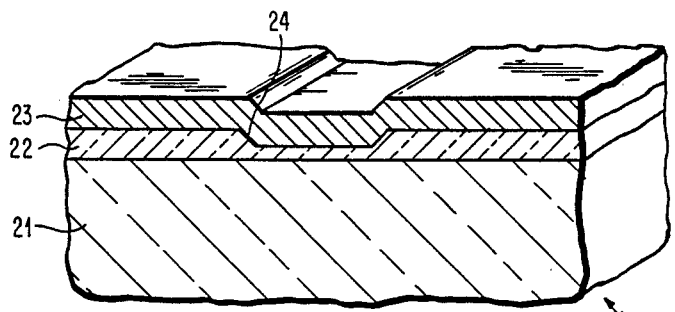
FIGS. 2A and 2B illustrate the method of a first embodiment of the present invention when applied to a conductive line formed in an insulating layer to produce a coplanar metal/insulator surface.

As shown in FIG. 2A, a structure 20 is represented, comprised of a substrate 21 which may be a semiconductor body or an insulating body having a substantially planar surface, with an insulating layer 22 thereon. For example, the dielectric material forming layer 22 may be sputtered silicon dioxide, the thickness of which is equal to the sum of the desired metal thickness and the underlying dielectric thickness (which can be zero). A polishing stop layer e.g. $Si_3N_4$ can be deposited on top of the quartz for better thickness control in polishing. Layer 22 is patterned with standard photolithographic techniques to produce the desired pattern, e.g. a trench 24. By trench is meant a recess of any arbitrary shape, which may penetrate either partially or totally the thickness of the insulating layer. The trench will be subsequentially filled with metal, to provide for instance a metal stripe 23a. A layer 23 of a high conductivity metal such as an Al-Cu alloy has been blanket deposited onto the structure and fills in particular said trench 24. The alloy is now removed down to the sputtered $SiO_2$ top surface leaving it intact in the trench, according to the following method.

The structure is placed in a commercially available parallel polisher such as the 18 inch diameter "Strasbaugh" single sided polisher or in the equipment described in the IBM Technical Disclosure Bulletin, Vol. 15, No. 6, November 1972, pages 1760-1761. The preferred composition of the polishing slurry may be prepared in two different ways. 1 gr. of $Al_2O_3$ powder (0.06 micron size) suspended in 1 liter DI water is mixed with a solution of 10 ml of $HNO_3$ in 90 cc of DI water, to reach a pH of about 3. Or, using two pumping systems, nitric acid is added with a needle valve to the first solution to reach the same pH. The other polishing conditions are summarized as follows:

polishing media: acidic based alumina slurry with a pH of about 3
slurry flow rate: 120 cc/min
polishing pressure: 2-8 psi
polishing pads: Rodel 210 I2 (from Rodel Products Corp.)

Polishing rates of the Al-Cu alloy and the sputtered $SiO_2$ were measured with a water based alumina slurry taken alone or in combination with different diluted acids. The results are presented in Table I below.

TABLE I

| No. | Slurry Composition | Al-Cu Rate | Sputtered $SiO_2$ Rate | Etch Rate Ratio |
|---|---|---|---|---|
| 1 | Alumina + DI water | 30 nm/min | 30 nm/min | 1 |
| 2 | Alumina + DI water + sulfuric acid (pH 2.2) | 85 nm/min | 33 nm/min | 3 |
| 3 | Alumina + DI water + nitric acid (pH 2.2) | 107 nm/min | 8 nm/min | 13 |
| 4 | Alumina + DI water + acetic acid (pH 2.8) | 150 nm/min | 42.5 nm/min | 3 |

Examination of Table I shows that addition of an acid improves either to some extent (cases 2 and 4) or significantly (case 3) the etching capabilities of a water based alumina slurry. Water based alumina slurries have been commonly used as a lapping abrasive to remove metal or prepare metal samples and apparently have been used to remove metal lands from the surface of a semiconductor structure for testing or probing purposes as explained above. However, as clear from case 1, the use of $Al_2O_3$ in water does not provide any removal selectivity between Al-Cu and sputtered $SiO_2$ as desired, meaning that the significant part of the $SiO_2$ layer is also removed in a poorly controllable process. In contrast, addition of an acid to produce a pH of less than about 3, and particularly the addition of $HNO_3$ produces a chem-mech polishing slurry which significantly increases the Al-Cu removal rate, while unexpectedly reducing simultaneously the sputtered $SiO_2$ removal rate, globally resulting in a large differential etch rate ratio. Although $HNO_3$ is a well known etchant for metals, surprisingly with the present method, the metal is not attacked in the trench at the end of the process. The above method was found reproducible in 12 separate polishing runs. In particular, a large differential etching rate ratio between Al/Cu and sputtered $SiO_2$ insures an excellent control over the thickness of the remaining metal in the trench, the $SiO_2$ layer acting as an automatic etch stop barrier.

Figure 2B:
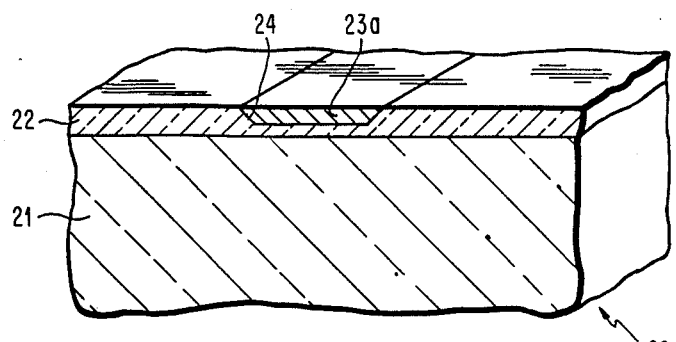

It is clear from FIG. 2B that the top surface of metal 23A filling the trench 24 may be considered as part of a conductor line or stripe embedded in an insulating layer. The result is therefore a coplanar metal/insulator film having a very smooth surface which may find wide applications.

Example II

Figure 3A:
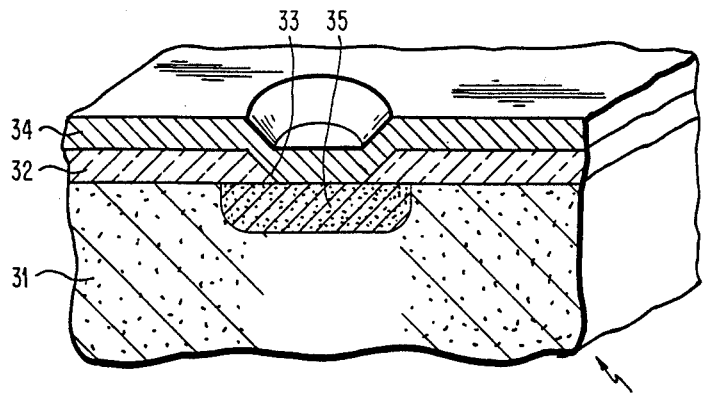
FIGS. 3A and 3B illustrate the method of the first embodiment of the present invention when applied to the formation of a metal filled via-hole formed in an insulating layer to produce a coplanar metal/insulating film.
Figure 3B:
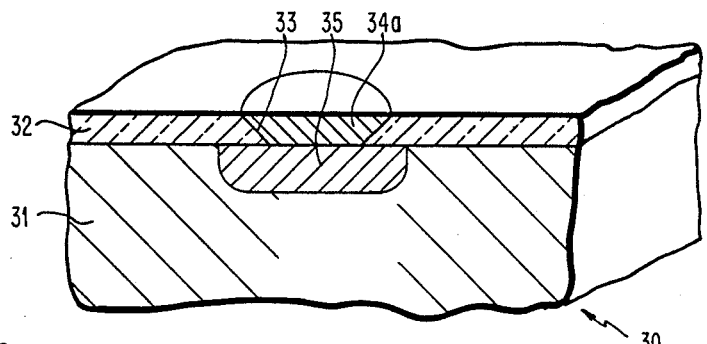

A limited portion of a semiconductor structure 30 is shown in FIG. 3A. It is comprised of a silicon substrate 31 of a predetermined type of conductivity passivated with a patterned insulating layer 32 of a dielectric material such as sputtered $SiO_2$. The insulating layer is provided with a via (or through) hole 33. By via-hole is meant a hole which penetrates totally the thickness of the insulating layer and when filled with metal provides electrical interconnection between conductive materials located at different levels. A layer 34 of a highly conductive metal such as Al-Cu has been blanket deposited on the structure. The metal makes an ohmic contact with a diffused region 35 previously formed in the silicon substrate. Although the description is made with reference to a silicon substrate, it is to be understood that the substrate might be either of the isolating type (e.g.) ceramic, glass, or a metal layer formed at a previous stage of the process. After the chem-mech polishing technique as described with respect to Example I has been practiced the resulting structure is shown in FIG. 3B. The via hole 33 is completely filled with metal and its top surface is coplanar with the top surface of the insulating layer 32. Metal 34a may be considered for example as a stud. In this case it is therefore also produced a coplanar metal/insulator film which may be used subsequently in a multilevel interconnection scheme. Before the metal deposition, either a platinum silicide contact may be formed with region 35 or a fill metal may contact metallurgy, if desired.

Example III

Figure 4:
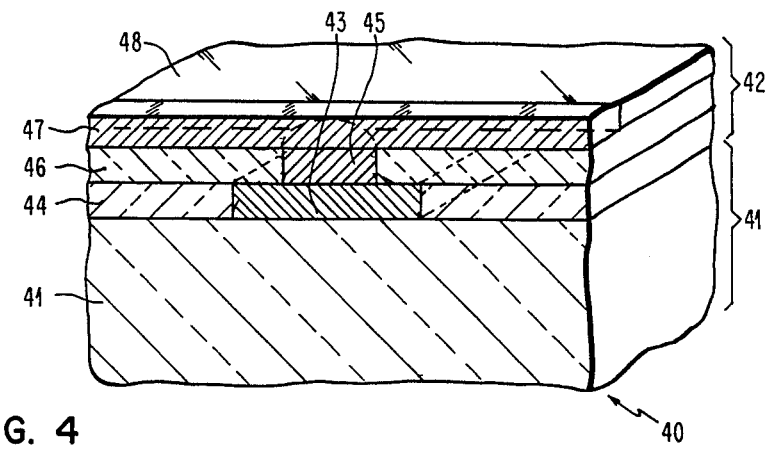
FIG. 4 illustrates the method of the first embodiment of the present invention combining the above steps to produce a planarized multilevel metal structure.

Combining the steps of forming either a conductive line as taught with respect to Example I and a metal filled via hole as taught in Example II leads to the fabrication of planarized multilevel metal structures. As shown in FIG. 4, a multilevel metal structure 40 is comprised of a substrate 41 provided with a multilayered metal structure 42. The structure 42 is formed by successive application of the above described chem-mech polishing techniques, to define, conductive line 43 in insulator 44, then the metal filled via hole 45 in insulator 46 and lastly conductive line 47 in insulator 48.

Polyimide may be used as an alternative to sputtered $SiO_2$ as the dielectric material. The sputtered $SiO_2$ layer is deposited by standard sputtering techniques, the polyimide is applied by standard spin and cure processes. Since the insulating layer is applied over a substantially flat surface, the layer need not be a planarizing film, so that fast deposition techniques such as PECVD may be used where oxides are concerned. Other dielectric materials such as doped or non-doped glasses, and various polymers as well may be used. The only limitation in materials used is their compatibility with the rest of the process, and the ability to form the trench or the viahole in the insulating layer. Both are defined by using standard photolithographic techniques. The intended metal pattern can then be transferred to the dielectric by wet or RIE etch techniques, although the latter are preferred where fine dimensions are required. Other possible techniques of forming the trench or the viahole include projected laser assisted etching, sputtering techniques or reactive ion beam etching. It is noted that fine metal geometries may be obtained because they are defined by the dimensions of the trench or of the viahole completed in the insulating layer. RIE of insulators is a better understood and more controllable process than RIE of metals. The present invention can take advantage of that difference. The metal can be deposited by any conformal technique, which includes sputtering, CVD or electroplating. Of course, the invention is not limited to aluminum and its alloys (Al-Si, Al-Cu) although they are preferred, other metals may be used as well. The broad concept of the invention, which is to use selective chem-mech polishing to produce coplanar metal/insulator films, being of wide application.

Chem-mech polishing processes with large removal rate ratios can be found for many combinations of metals and dielectric materials. The advantages of the chem-mech technique are that it is faster than lift-off processes, less expensive, and extendable to finer dimensions. It is applicable to a wider range of metals compared to metal RIE techniques. In contrast to dry-etch planarization techniques, chemmech planarization produces planar structures with the upper surface of the overlying material being coplanar with the upper surface of the initially covered material, since a selective slurry will not remove significantly the latter material, which will be used as an automatic etch stop layer. It is applicable to a wider range of metals than dry-etch planarization techniques, and is more controllable.

Figure 5:
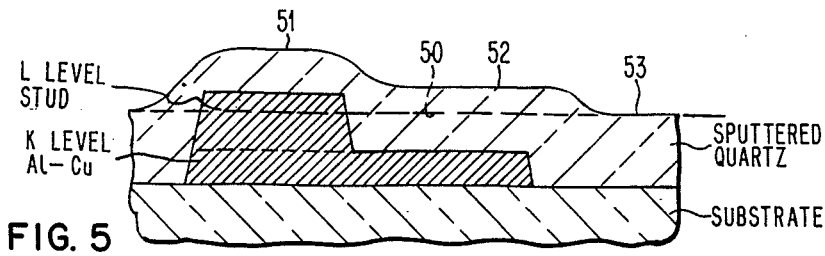
FIG. 5 illustrates the method of a second embodiment of the present invention when applied to a layer of insulating material deposited upon an underlying level of patterned metal to produce a coplanar insulator/metal surface.

In a second embodiment of the invention, a layer of insulating material is deposited upon an underlying level of patterned metal, such as shown in FIG. 5. With an appropriate change in the slurry constituency, the chem-mech polishing technique of the present invention can be adapted to planarize to the dashed line 50 the insulated structure by selectively removing the overlying insulating material at a significantly higher rate than the underlying conductive metal to be exposed at the termination of the polishing. For example, where the insulating material is sputtered quartz and the metal is Al-Cu, an appropriate slurry comprises a basic solution (pH about 11 to 11.5) of potassium hydroxide and silica particles having approximately 1 to 10% solids content. The polishing pad material preferably is polyester and is firm enough so that it does not deform under the polishing load. During the initial planarization action, the insulating material at high point 51 is removed at a higher rate than at lower points 52 and 53 due to the topography of the underlying metal structure. Again, a polishing etch stop layer, per se, may be used, if desired, but becomes optional if the selectivity of the slurry increases as to the removal rate of the overlying layer relative to the removal rate of the underlying layer. Suitable polishing etch stop materials include, for example, organic polymers such as polyimide films (when etching plasma or CVD deposited $SiO_2$) or inorganic materials such as plasma silicon nitride, MgO or $Al_2O_3$ (when etching sputtered ($SiO_2$).

It has been found preferable in the second embodiment for optimum planarization results, irrespective of the size and density of the high point features such as 51, relative to the remainder of the surface of the underlying structure, that the thickness of the deposited insulation material be made less than the combined thickness of the L and K level metal. In general, the insulation material thickness should be chosen so that in chemmech polishing, the metal of the studs is reached before the complete planarization of the insulating material is achieved. Ordinarily, it is more difficult to remove the quartz of FIG. 5 over large features, such as large studs or uniformly over large arrays of studs than over isolated studs if the quartz thickness is too great. By limiting the quartz thickness to an amount somewhat less than the metal thickness being covered, the quartz tends to be removed at about the same time over the various high points.

What is claimed is:

1. In the fabrication of planarized multilevel metal on a semiconductor substrate having active devices therein, the method for producing said multilevel metal comprising substantially coplanar conductive and insulator films on said substrate comprising the steps of:
    forming a first layer of either said conductive film or said insulator film on said substrate,
    said first layer having a non-planar upper surface,
    depositing a second layer of the other of said conductive film or said insulator film on said first layer,
    said second layer having an upper surface generally following the topography of the upper surface of said first layer, and
    chem-mech polishing said structure in order to remove said second layer at a faster rate than said first layer until the upper surfaces of said first and second layers are substantially coplanar.

2. The method of claim 1 wherein said first layer is said insulator film and said second layer is at least as thick as the extent of non-planarity of said upper surface of said first layer.

3. The method of claim 1 wherein said first layer is said conductive film and said second layer is not as thick as the extent of non-planarity of said upper surface of said first layer.

4. The method of claim 1 and further including the use of a chem-mech polishing slurry comprising a solution of dispersed alumina powder.

5. The method of claim 1 wherein said first layer is said conductive film and further including the use of a chem-mech polishing slurry comprising a solution of dispersed silica particles.

6. The method defined in claim 4 wherein said solution is an acidic solution and said conductive film is a metal.

7. The method defined in claim 6 wherein said metal is selected from the group, consisting of Al, Al-Si and Al-Cu and the insulating film is $SiO_2$.

8. The method defined in claim 7 wherein said acidic solution has a pH of less than about 3.

9. The method defined in claim 8 wherein said acidic solution comprises an acid selected from the group consisting of $H_2SO_4$, $CH_3COOH$ and $HNO_3$.

10. The method defined in claim 1 wherein an etch stop barrier layer is placed in between said first and second layers.

11. The method in claim 1 wherein said steps are repeated in sequence.

* * * * *